United States Patent
Sombrin et al.

(10) Patent No.: US 10,133,833 B2
(45) Date of Patent: Nov. 20, 2018

(54) METHOD AND DEVICE FOR PREDICTIVE EVALUATION OF THE INTERMODULATION POWER IN AN ELECTRONIC DEVICE

(71) Applicant: CENTRE NATIONAL D'ETUDES SPATIALES—C N E S, Paris (FR)

(72) Inventors: Jacques Sombrin, Toulouse (FR); Geoffroy Soubercaze-Pun, Flourens (FR); Isabelle Albert, Escalquens (FR)

(73) Assignee: CENTRE NATIONAL D'ÉTUDES SPATIALES—C N E S, Paris (FR)

( * ) Notice: Subject to any disclaimer, the term of this patent is extended or adjusted under 35 U.S.C. 154(b) by 516 days.

(21) Appl. No.: 14/650,381

(22) PCT Filed: Dec. 9, 2013

(86) PCT No.: PCT/FR2013/053001
§ 371 (c)(1),
(2) Date: Jun. 9, 2015

(87) PCT Pub. No.: WO2014/091133
PCT Pub. Date: Jun. 19, 2014

(65) Prior Publication Data
US 2015/0310144 A1 Oct. 29, 2015

(30) Foreign Application Priority Data
Dec. 10, 2012 (FR) .................................. 12 61839

(51) Int. Cl.
*G01R 29/26* (2006.01)
*G06F 17/10* (2006.01)
*G06F 17/17* (2006.01)
*G06F 17/50* (2006.01)

(52) U.S. Cl.
CPC .......... *G06F 17/5009* (2013.01); *G06F 17/10* (2013.01); *G06F 17/17* (2013.01); *G01R 29/26* (2013.01)

(58) Field of Classification Search
CPC ...................................... G06F 17/5009
USPC ............................................... 703/6
See application file for complete search history.

(56) References Cited

U.S. PATENT DOCUMENTS

| | | | | |
|---|---|---|---|---|
| 5,663,890 A | * | 9/1997 | Saleh ................. | G06F 17/5036 327/551 |
| 6,216,100 B1 | * | 4/2001 | Meghdadi ............ | H03F 1/3241 703/14 |

OTHER PUBLICATIONS

International Search Report dated Mar. 6, 2014, corresponding to PCT/FR2013/053001.
Jacques Sombrin, Non linéarités passives, Conférence XLIM 4, Apr. 4, 2012, pp. 1-22 (partial English language translation).
Jacques Sombrin, et al.; "New Models for Passive Non Linearities Generating Intermodulation Products with Non-Integer Slopes"; Apr. 8, 2013, Antennas and Propagation (EUCAP), 2013 7th European Conference on, IEEE; pp. 25-28.

(Continued)

*Primary Examiner* — Hugh M Jones
(74) *Attorney, Agent, or Firm* — Burris Law, PLLC

(57) ABSTRACT

A method and a device for predictive evaluation of intermodulation power in an electronic device in which a predictive function f makes it possible to evaluate in a predictive manner values of power of an intermodulation component produced by an intermodulation distortion of an input signal, characterized in that the predictive function f includes an odd part V obtained by multiplication of an odd function F and of a function G, obtained by composition of a positive real-valued even function g and of a function Q in the form of a real series including at least one term of degree q belonging to the non-integer reals.

15 Claims, 3 Drawing Sheets

(56) References Cited

OTHER PUBLICATIONS

Justin Henrie, et al.; "Prediction of Passive Intermodulation From Coaxial Connectors in Microwave Networks"; IEEE Transactions on Microwave Theory and Techniques, IEEE Service Center; vol. 56, No. 1, 2008, pp. 209-216.
Ahmed Sedek Mahmoud Sayed; "Ultra Wideband 5 W Hybrid Power Amplifier Design Using Silicon Carbide MESFETs"; PhD Thesis; May 31, 2005; pp. 52-53.
Ron Doerfler; "Fast Approximation of the Tangent, Hyperbolic Tangent, Exponential and Logarithmic Functions"; Oct. 11, 2007; pp. 8-9.
G. Baruffa, et al.; "A Fast Algorithm to Find Generic Odd and Even Order Intermodulation Products"; IEEE Transactions on Wireless Communications, IEEE Service Center; vol. 6, No. 10; Oct. 2007; pp. 3749-3759.
N. Blachman; "Detectors, Bandpass Nonlinearities, and Their Optimization: Inversion of the Chebyshev Transform"; IEEE Transactions on Information Theory; vol. 17, No. 4, Jul. 1971; pp. 398-404.
P. Bolli, et al.; "Passive Intermodulation on Large Reflector Antennas"; IEEE Antennas and Propagation Magazine, IEEE Service Center, vol. 5, No. 44; Oct. 2002; pp. 13-20.
J. Sombrin, et al., "Multicarrier Passive Inter-Modulation Prediction from 2-Carrier Measurements", 31t AIAA International Communication Satellite Conference, Oct. 14-17, 2013, Florence, Italy.
International Search Report dated Mar. 6, 2014, corresponding to PCT/FR2013/053001, 3 pp.

\* cited by examiner

METHOD AND DEVICE FOR PREDICTIVE EVALUATION OF THE INTERMODULATION POWER IN AN ELECTRONIC DEVICE

The invention relates to a method and a device for the predictive evaluation of intermodulation power in an electronic device.

Intermodulation phenomena occur in electronic devices processing several frequencies simultaneously and comprising non-linear electronic components. Intermodulation, in an output signal of the electronic device, is the result of distortions generated by these non-linear electronic components from an input signal of the electronic device. Intermodulation is particularly exhibited by the occurrence of new frequency components in the output signal. The frequencies of these intermodulation components are obtained by adding or by subtracting multiples of the frequencies present in the input signal. The result of adding multiplication factor modules of the input frequencies used to compute the frequency of an intermodulation component is designated "intermodulation order".

The intermodulation phenomena can be owing to active electronic components, such as amplifiers, or to passive electronic components, such as connectors, filters or antennae. The active intermodulation distortions (owing to the active components) are much more powerful than the passive intermodulation distortions (owing to the passive components), but they are also more easily known and therefore can be corrected: for example, they can be eliminated using a suitable filter, particularly using an output filter of an amplifier with significant rejection in the reception band.

However, not all of the passive intermodulation distortions can be eliminated by filtering, particularly because they can be generated in the filter or in the passive equipment downstream of the filter. Furthermore, they become very powerful in electronic devices operating at high power levels. In reception electronic devices that are disposed within range, in particular within the vicinity, of devices operating at high power, the passive intermodulation distortions are therefore dominant relative to the active intermodulation distortions.

More specifically, in wideband electronic telecommunication devices, passive intermodulation products coming from transmission signals have frequencies in the reception band. This is increasingly the case since the telecommunication radio frequency bands are increasingly crowded. However, as the power of the reception signals is still less than that of the transmission signals, the passive intermodulation products coming from transmission signals can introduce considerable noise to the reception of signals.

This is the case, for example, in transmission/reception devices for long-range telecommunication signals that use a large number of carrier frequencies in the wideband in transmission and in reception. This phenomenon is particularly disruptive in telecommunication devices on board satellites, aeroplanes or on the ground in telecommunication relays for mobile telephones. The intermodulation phenomena are significant enough to have led some satellite manufacturers to duplicate their transmission/reception device, which represents a very high additional manufacturing and launching cost. In particular, such devices still have very strict technical specifications owing to significant computation margins, such that the hardware that is used is particularly expensive, sometimes without reason as their real behaviour is less of a disadvantage than anticipated.

It is therefore important to be able to simulate the behaviour of such an electronic device, named simulated device, in order to be able to evaluate and predict the power levels of these intermodulation products and to thus better take them into account when designing the simulated device itself and/or a system incorporating said device. An efficient method for the predictive evaluation of intermodulation power also must allow the measuring and verification steps before commissioning to be simplified.

Numerous models have already been developed in order to model and attempt to predict the behaviour of an electronic component or of a non-linear electronic device. In most of the models, a simple polynomial is used to model the behaviour of the simulated device. Such a polynomial allows intermodulation powers to be predicted that generate over integer slopes, i.e. the intermodulation powers generate over integer exponents as a function of a power of at least one component of the input signal.

"Slope" refers to the direction coefficient of a dB/dB function that matches a power of the input signal to a power of a component of the output signal. For example, the slope representing the dependency of the power, in the output signal, of a carrier component introduced into an input signal is expressed as a function of its power in the input signal. Advantageously, the dependency of the power, in the output signal, of a component coming from an intermodulation product also can be expressed as a function of the power of another distinct frequency component (carrier, for example) introduced into the input signal or as a function of the total power of the input signal.

The slopes correspond to the degree(s) of the term(s) of the polynomial. However, the measurements carried out on electronic devices are not always coherent with modelling with integer slopes.

Polynomials comprising numerous terms therefore have been proposed in order to better approximate the observed measurements. Thus, the following document is known: "*Prediction of passive intermodulation from coaxial connectors in microwave networks*", Henrie J., Christianson A., J. Chappell W., Purdue University, in IEEE Transactions on Microwave Theory and Techniques, Vol. 56, No. 1, January 2008.

In this document, a 49-degree and 24-term polynomial function is used to approximate a measurement curve of an intermodulation power for a specific intermodulation product (i.e. at a specific frequency, in this case the third order passive intermodulation).

However, this function does not allow the intermodulation powers of the other intermodulation products to be predicted at other frequencies (intermodulation orders 5, 7, etc., for example).

Furthermore, if such a function adequately approximates the third order intermodulation power values over the range of measured values, it rapidly diverges beyond this range of values, particularly owing to the term of degree 49. It is therefore impossible, with such a function, for the behaviour of the simulated device to be predicted beyond the maximum power value of the input signal for which intermodulation power measurements have been carried out.

Therefore, the object of the invention is to overcome these disadvantages.

The object of the invention is to propose a reliable and accurate method for the evaluation and prediction of intermodulation powers in an electronic device.

In particular, the object of the invention is to propose a method for obtaining intermodulation powers that are close to reality for ranges of non-measured values.

A further object of the invention is to propose a method for obtaining intermodulation powers for intermodulation components (frequencies) on which (for which) no measurement has been carried out.

More specifically, the object of the invention is to propose a method for obtaining a function representing the real behaviour of the electronic device.

A further object of the invention is to propose a method for quickly obtaining a function representing the real behaviour of the electronic device.

A further object of the invention is to propose a method in which fewer measurements are carried out on the electronic device.

The invention particularly relates to a method in which full power measurements do not need to be carried out on the electronic device.

More specifically, the invention proposes a method for the evaluation of intermodulation power in a passive device.

The object of the invention is to propose a method for determining the powers of intermodulation components produced by a non-linear electronic device, named simulated device, and for which the frequencies are in the reception band of an electronic device receiving signals produced by the simulated device.

Throughout the document, "intermodulation power" refers to the power of an intermodulation product (of determined order and thus of determined frequency). Such an intermodulation power can be expressed in Watts (W), milliWatts (mW) or dBm (dBmW, that is in decibels relative to one milliwatt (1 mW)).

"Intermodulation ratio" refers to the ratio of an intermodulation power at the output of a simulated device to the power of a signal applied at the input of said simulated device, particularly to the power of a carrier signal. Such a ratio also can be the expression of the sum of the intermodulation powers of each intermodulation product over the total power of the input signal (all input components combined). Such an intermodulation ratio is expressed in dB, for example.

"Real series" refers to any function that can be expressed in the form of a sum with a finite or infinite number of terms, with power functions with integer or real exponents. Therefore, the definition of the integer series is extended to a series, named real series, that can comprise at least one non-integer real number term of degree. More specifically, "real polynomial" refers to a function made up of a finite sum of power functions, for which at least one of the exponents can be a non-integer real number.

Therefore, the invention relates to a method for the predictive evaluation of intermodulation power in an electronic device, named simulated device, comprising at least one signal input and one signal output, wherein:
  a signal, named input signal, comprising at least two distinct frequency components is introduced at an input of the simulated device;
  values, named measured values, representing at least one power of at least one component of a signal, named output signal, produced by the simulated device at an output of the simulated device from the input signal, are obtained by measuring said at least one power;
  power values, named intermodulation powers, of at least one component, named intermodulation component, of an output signal, produced by an intermodulation distortion between at least two components of the input signal, are predictively evaluated on the basis of a function, named predictive function f, that is determined using at least two measured values, wherein:

the predictive function f comprises at least one odd part $V = F \cdot G$, formed by the multiplication
  of an odd function F,
  and of a function $G = Q \circ g$ that is the compound
    of an even function g such that $g: \mathbb{R} \to \mathbb{R}^+$,
    by a function Q in the form of a series, named real series, comprising at least one term of degree q, with $q \in \{\mathbb{R}_+ - \mathbb{N}\}$.

The function Q is advantageously expressed in the form of a real series. However, the function Q can be expressed in other distinct conventional forms as long as it can be developed as a real series.

The simulated device comprises at least one non-linear component for processing the signal between the input on which the input signal is introduced and the output on which the output signal is measured in order to obtain said measured values. A non-linear simulated device is, for example, a connector, a waveguide, a transmission antenna, a reception antenna, a filter, a transmission/reception antenna or a series and/or parallel combination of one or more of these components.

The simulated device is, for example, a communication device, particularly for transmitting/receiving a plurality of modulated signals. The simulated device is adapted to be able to operate at high transmission powers, particularly with a large number of carrier frequencies simultaneously in the same transmission band.

The invention allows the evaluation, by computation and in a predictive manner, from a limited number of measurements, of intermodulation powers in the real operating conditions of the simulated device. Such a method is particularly advantageous for satellites that are inaccessible once they are operating.

Such a method significantly reduces the ground-based testing costs. Indeed, by virtue of this method, it is no longer necessary for a large number of measurements to be carried out at high powers corresponding to the operation of the simulated device in real conditions.

The output signal of a non-linear simulated device into which the input signal with two distinct frequency components f1 and f2 has been introduced particularly comprises frequency components f1 and f2, but also harmonic components (H) that are multiples of these frequencies ($H_2 = 2f1$ and 2f2, $H_3 = 3f1$ and 3f2, etc.), as well as frequency intermodulation (IM) components, named intermodulation frequencies, obtained by adding or by subtracting multiples of the frequencies f1 and f2 ($IM_2 = f2 - f1$ and $f1 + f2$; $IM_3 = 2f2 - f1$ and $2f1 - f2$; $IM_4 = 2f2 - 2f1$ and $2f2 + 2f1$; $IM_5 = 3f2 - 2f1$ and $3f1 - 2f2$; etc.). The order of each intermodulation component is computed as the sum of the module of the multiplication coefficients applied to the frequencies f1 and f2 to obtain the frequency of said intermodulation component. Therefore, the frequencies $IM_2$ correspond to second order intermodulation products, the frequencies $IM_3$ to third order intermodulation products, etc.

"Harmonic rank" or "zone number" refers to the sum of the multiplication coefficients of the harmonics or intermodulations. For example, the third order intermodulation $IM3 = 2f2 - f1$ is in the first zone (or rank 1), whereas the second order intermodulation $IM2 = f1 + f2$ is in the second zone (or harmonic rank 2).

It can be seen that the most disruptive intermodulation components are the odd order intermodulation components, the frequencies of which are close to the frequencies f1 and f2, i.e. the odd order intermodulation components of the first zone (rank 1). Indeed, they are difficult to filter and they can be found in a reception band, in particular in a wideband.

Indeed, in wideband transmission/reception devices, the reception band is, relative to the width of the band, close to the transmission band.

The frequencies of the input signal components are advantageously, and according to the invention, selected in a passband of the simulated device. For an electronic transmission/reception device, the frequencies of the input signal components are selected in the transmission band of the device. Indeed, in such a device some of the intermodulation components coming from input signal components with frequencies in the transmission band have frequencies in the reception band and introduce noise to the received signals.

A method according to the invention allows a predictive function f to be determined that is very close to the transfer function of the simulated device, for which behaviour modelling and prediction is sought.

The predictive function f is advantageously used to extrapolate the measured values on an intermodulation component to intermodulation components of different orders.

Therefore, a method according to the invention advantageously allows intermodulation powers to be predicted for intermodulation components with frequencies distinct from those on which the measured values have been measured.

Therefore, in a method according to the invention, measured values are obtained by measuring power on the intermodulation components (in an output signal) with the highest powers in order to minimise the measurement error, whilst being able to obtain predictive values on the intermodulation powers of other intermodulation components.

Similarly, according to the invention, the complexity of the predictive function f model is selected as a function of the frequency spacing of the intermodulation components for which the predictive determination of the powers is sought relative to the intermodulation components on which the measured values have been measured.

Thus, measurements are carried out on the third order intermodulation component, for example, then the predictive function f is determined and, finally, this predictive function f is used to predictively obtain the values of the intermodulation powers of the fifth and seventh order intermodulation components. If the object is to obtain the intermodulation powers of the $11^{th}$ and $13^{th}$ order intermodulation components (for example, because they have frequencies in the reception band of a receiver device of the simulated device), power measurements are at least carried out on the $11^{th}$ order intermodulation component. In this way, when measurement is possible, measurements are advantageously carried out on the one or more intermodulation components, the presence of which is known to be able to disrupt the operation of the simulated device or of receiver devices of the simulated device.

The predictive function f is also advantageously used to extrapolate the measured values to input signal power ranges for which no measurement is carried out.

A method according to the invention also allows intermodulation powers to be theoretically determined that have not been measured on a prototype of the simulated device or on the simulated device itself, and without having to make it operate at its normal operating power. A method according to the invention is particularly advantageous for carrying out a predictive evaluation of the intermodulation power in an electronic signal transmission/reception device.

More specifically, a method according to the invention advantageously allows intermodulation powers to be determined for at least one intermodulation component for a complete range of input signal powers, even though the measured values have only been carried out on a limited range of input signal powers.

The input signal used to carry out these measurements is low powered as it only comprises a limited number of components, in particular a limited number of carrier components. However, an electronic transmission/reception device is adapted, in real conditions, to process a large number of carrier signals in parallel, so that the total power processed in real conditions by the electronic device is much higher.

A method according to the invention therefore allows intermodulation powers with high input signal powers to be evaluated and predicted. Such a method allows intermodulation powers to be predicted for a large number of components in the input signal solely on the basis of measurements carried out on an output signal produced with an input signal that comprises only two distinct frequencies, particularly two carrier frequencies for electronic telecommunication devices.

To this end, in a method according to the invention, when the predictive function f is a simple function, an analytical computation is carried out. Otherwise, when the predictive function f is a more complex function, a simulation and a digital computation allows these predictive values to be obtained.

The invention allows a method for the evaluation of intermodulation power to be obtained in which a simple model is used.

For the first time, the invention allows a method to be obtained for the evaluation of intermodulation power that is particularly reliable and close to reality. A predictive function f constructed according to a method according to the invention allows a particularly reliable model to be obtained of a non-linear electronic device, in particular a passive electronic device.

Indeed, the intermodulation power measurements are seldom generated over integer slopes (in dB/dB). The measurements more generally show intermodulation powers generating over fractional or real slopes, which is often interpreted as measurement uncertainty.

However, a predictive function f constructed according to the method according to the invention effectively allows intermodulation power values to be obtained that generate over fractional or real slopes, in accordance with the observations.

Furthermore, a predictive function f according to the invention allows intermodulation power values to be obtained that generate over even integer slopes for odd order intermodulation components and over odd integer slopes for even order intermodulation components.

Indeed, the degree of at least one term of the real series of the function Q belongs to all of the real positives to the exclusion of the natural numbers. The odd part of the predictive function f therefore allows intermodulation power slopes to be obtained with a fractional or real value, which corresponds to the real behaviour of most non-linear electronic devices, particularly passive devices.

A method according to the invention allows an electronic device to be modelled with intermodulation powers that generate over non-integer slopes by virtue of the non-integer real number term of degree of the function Q. However, in certain particular cases, the intermodulation powers of an intermodulation component generate over part of a range of powers of the input signal over a slope with a value that is close to or equal to a natural number.

For this reason, advantageously, in certain embodiments of a method according to the invention, the function Q further comprises at least one term of degree n, with n∈ℕ. The function Q therefore can comprise one or more terms of degree n selected from all of the natural numbers (ℕ) and one or more terms of degree q selected from all of the positive non-integer real numbers (ℝ$_+$−ℕ).

The value of each degree q also advantageously can be selected as a function of technical characteristics of the simulated device. Therefore, in a method according to the invention, the value of each degree q can be selected without any prior measurement on the simulated device.

Indeed, the non-integer real number degree q represents technical characteristics of the simulated device. More specifically, the non-integer real number degree q represents the physical behaviour of the simulated device, more specifically, it represents at least part of the physical behaviour of the simulated device. The non-integer real number degree q particularly represents the non-linear behaviour of the simulated device for at least one intermodulation component in at least one range of input signal power values.

However, the non-linearity of the simulated device particularly depends on its type, its constituent materials and, where necessary, on the quality of its electrical contacts. For example, the non-linear behaviour of a radio communication antenna mainly depends on its type and on the material from which its reflective part is produced (metal, composite (carbon fibres with strands in three directions, for example), etc.).

A predictive function f constructed according to a method according to the invention thus allows intermodulation power values to be obtained that generate over at least two distinct slopes on two distinct ranges of input signal power values, with at least one of the slopes being an integer slope and of the same parity as the order of the intermodulation component for which the intermodulation power is evaluated.

Furthermore, in certain embodiments of a method according to the invention:
  intermodulation powers of said intermodulation component are predictively evaluated from a function, named comparative function h;
  said comparative function h is a polynomial with terms of degree t, with t∈ℕ;
  the intermodulation powers of said intermodulation component obtained from the comparative function h are compared to the intermodulation powers of said intermodulation component obtained from the predictive function f.

The comparative function h corresponds to a function of the prior art. Therefore, in the invention, the results obtained by a method according to the invention are compared to the results obtained by a prior method.

In particular, for an intermodulation power of a third order intermodulation component, a polynomial comparative function h comprising a term of degree 3 is used.

Furthermore, a method according to the invention is also characterised in that a value corresponding to a power ratio of an input signal to the power of an intermodulation component is computed on the basis of the predictive function f. A technical specification of a simulated device is therefore determined.

Moreover, it has been shown that simulating an electronic device using a method according to the invention is much closer to the real behaviour of the device, thus allowing the specifications provided by other methods implementing a function of the comparative function h type to be relaxed (see "*Multicarrier Passive Inter-modulation Prediction from 2-carrier measurements*", Sombrin, Soubercaze-Pun, Albert, 31st AIAA International Communication Satellite Conference, Oct. 14-17, 2013, Florence, Italy). Thus, an operator can select a lower quality, and thus cheaper, simulated device in order to adhere to the same technical specification level.

The function g is even and has positive values in all of the real numbers so that, regardless of the function Q, the function G=Q∘g is even. Therefore, the function V=F·G, with F being odd, is odd.

Advantageously and as claimed in the invention, the function g is the module function g such that:

$$g: |u|, \forall u \in \mathbb{R}.$$

The module function is, among the even functions with positive values in ℝ, a particularly simple function allowing simple analytical computations to be carried out. Indeed, it does not modify the absolute value of its variable.

Therefore, (Q∘g) is even and the only influence of g is to force this parity, without modifying the amplitude provided by Q.

Advantageously and as claimed in the invention, the function F is the sign function that assigns its sign to any element of ℝ:

$$F: u \to \text{sign}(u), \forall u \in \mathbb{R}.$$

Thus, the function F is the sign function such that:

$$F(u)=-1, \forall u \in \mathbb{R}^*_-$$

$$F(u)=0, u=0$$

$$F(u)=+1, \forall u \in \mathbb{R}^*_+$$

The sign function is particularly advantageous as it allows the sign of the function G, which is purely even, to be re-established as a function of its variable, which sign is lost by combining the module function g with the function Q.

Furthermore, the sign function is constant by absolute value, which eliminates its influence in the predictive computation of the intermodulation powers.

Thus, F·(Q∘g) is odd and the only influence of F is to assign a sign, without modifying the amplitude provided by (Q∘g).

Alternatively, advantageously and as claimed in the invention, the function F is a hyperbolic tangent function in the form:

$$F: u \to \tan h(ku), k \in \mathbb{R}, \forall u \in \mathbb{R}.$$

Indeed, the sign function has the disadvantage of being interrupted in zero. This can make it impossible for some simulation software to be used.

Therefore, F is advantageously selected as equal to tan h(ku), with k selected high, in particular k is such that ku is higher than 1 for all values of u, in particular k is higher than 10, more specifically, k is higher than 100. Indeed, when k tends towards infinity, tan h(ku) tends towards the sign function. Furthermore, the hyperbolic tangent function, especially in the tan h(ku) form, with k selected high, only modifies the amplitude provided by (Q∘g) when it is close to zero.

Advantageously and according to the invention, the function Q comprises a finite number of non-zero terms.

Advantageously and as claimed in the invention, the function Q is a polynomial, named real polynomial, comprising at least one term of degree q, with q∈{ℝ$_+$−ℕ}.

Furthermore, the function Q advantageously comprises less than five terms. More specifically, the real polynomial function Q comprises less than three terms, particularly less than or equal to two.

The function Q used in the construction of the predictive function f therefore is particularly simple, so that f is also simple.

The limited number of terms in the real polynomial function Q also allows a model to be obtained for reliable intermodulation powers beyond power ranges of the input signal used to obtain the measured values. Therefore, in a method according to the invention, a predictive function f is obtained representing the behaviour of the simulated device that does not rapidly diverge beyond measurement ranges and which, on the contrary, corresponds to the measurements observed on a number of electronic devices.

Advantageously and as claimed in the invention, the measured values comprise a plurality of values of intermodulation powers measured on the same intermodulation component.

More specifically, advantageously and as claimed in the invention, the measured values are obtained by measuring power on at least one intermodulation component present in the output signal. The measured values are therefore obtained by measuring intermodulation powers.

More specifically, advantageously and as claimed in the invention, only intermodulation powers are measured. Thus, all of the measured values are intermodulation power values. In particular, the measured values are power values of one or more intermodulation components carried out for one or more distinct powers of the input signal.

Advantageously, the measured values are made up of intermodulation power values of a plurality of intermodulation components for a plurality of distinct powers of the input signal.

Advantageously and as claimed in the invention, each intermodulation power of each intermodulation component is evaluated, i.e. computed, by a Chebyshev transform of at least part of the predictive function f.

Each intermodulation power of each odd order intermodulation component is determined by the Chebyshev transform of the odd part of the predictive function f.

More specifically, the m order ($m \in \mathbb{N}$) Chebyshev transform of the predictive function f allows the amplitude, and therefore the power, to be obtained of the m order intermodulation component of an output signal as a function of the amplitude (and therefore of the power) of an input signal and/or of a component of the input signal.

Therefore, for a real polynomial function Q such that:
$$Q: u \to u^q, \forall u \in \mathbb{R}, \forall q \in \mathbb{H}_+$$

$$u = a \cdot \cos(\theta)$$

the output signal can be represented by:

$$v = f(u) = f(a \cdot \cos(\theta))$$
$$= \frac{1}{2} f_0(a) + \sum_{m=1}^{\infty} f_m(a) \cdot \cos(m\theta), \quad m \in \mathbb{N}$$

where $f_m(a)$ is the m order Chebyshev transform of f(u):

$$f_m(a) = \frac{1}{\pi} \int_{-\pi}^{+\pi} f(a \cdot \cos(\theta)) \cdot \cos(m\theta) \cdot d\theta, \quad m \in \mathbb{N}$$

Therefore, by taking the example of a real polynomial function Q such that:

$$Q: u \to u^q, \forall u \in \mathbb{R}, \forall q \in \mathbb{H}_+$$

$$f: u \to F(u) \cdot |u|^q, \forall u \in \mathbb{R}, \forall q \in \mathbb{H}_+$$

and with the sign function for function F, an m order Chebyshev transform is obtained of the predictive function f in the form:

$$f_m(a) = 2\mathrm{sign}(a) \cdot \left(\frac{|a|}{2}\right)^q \frac{\Gamma(q+1)}{\Gamma\left(\frac{q+m}{2}+1\right) \cdot \Gamma\left(\frac{q-m}{2}+1\right)}, \quad \forall m \in \mathbb{N}$$

where a is the amplitude of the input signal u, $f_m(a)$ is a function, named predictive intermodulation function, obtained by the m order Chebyshev transform of the predictive function f, $\Gamma$ is the extension of the factorial function to the set R of real numbers.

For the first time, the odd part V of the predictive function f allows all of the intermodulation powers of the odd order intermodulation components (of frequencies $IM_3$, $IM_5$, $IM_7$, etc.) to be modelled, regardless of the degree of the function Q, as long as said function comprises a purely real or fractional (non-integer) term of degree. Thus, there is no requirement for selecting a high degree term of Q in order to obtain the intermodulation powers of the products of high odd orders.

When F is in the form tan h(ku), the analytical form of each m order predictive intermodulation function $f_m$ (obtained by the m order Chebyshev transform of the predictive function f) is complex, so that it is obtained by digital computation or by simulation. Indeed, the analytical form of the predictive intermodulation functions $f_m$ is then much more complex than when F is the sign function.

Advantageously and as claimed in the invention, the predictive function f further comprises an even part U added to the odd part V, so that the predictive function f is in the form f=U+V, with U=P∘g that is the compound:
of an even function g, such that g: $\mathbb{R} \to \mathbb{R}^+$,
by a function P in the form of a series, named real series, comprising at least one term of degree p∈{ $\mathbb{R}$ −{2n,n∈ $\mathbb{N}$ }}.

As is the case for Q, the function P advantageously is a function that can be developed in the form of a real series.

The even part U of the predictive function f allows, in a method according to the invention, the predictive evaluation of the intermodulation powers of all of the even order intermodulation components (of frequencies IM2, IM4, IM6, etc.). This is particularly advantageous when the reception band is spaced apart from the transmission band, particularly when the reception band is wide or is not fully contained in the band ranging from half to one and a half times the central transmission frequency.

As is the case for the odd order intermodulation components, each intermodulation power of each even order intermodulation component is determined by the Chebyshev transform of the same order as the even part of the predictive function f.

The coefficients and the exponents of the terms of the function U, particularly of the function P, are determined using the same method as described above. A digital optimisation method particularly allows the mean error between the measured values and the values predicted by a predictive intermodulation function G to be minimised.

Advantageously and according to the invention, the function P comprises a finite number of non-zero terms.

Furthermore, advantageously and as claimed in the invention, the function P is a polynomial, named real polynomial, comprising at least one term of degree p, with $p \in \{\mathbb{R}_+ - \{2n, n \in \mathbb{N}\}\}$.

Furthermore, the function P advantageously comprises less than five terms. More specifically, the real polynomial function P comprises less than three terms, particularly less than or equal to two.

The function P used in the construction of the predictive function f therefore is particularly simple, so that f is also simple.

Therefore, as previously seen, by virtue of the purely real term of P, the even part U of the predictive function f allows, despite a low number of terms in P and a low degree of P, the evaluation of all of the intermodulation powers of even intermodulation products of a simulated device.

In order to only evaluate the intermodulation powers of even intermodulation products, according to a method according to the invention, only the Chebyshev transforms of the even part are used.

If the requirement is to only determine the intermodulation powers of even intermodulation products, the odd part V of the predictive function f can be rendered zero.

The even part U of the predictive function f also allows electronic devices to be modelled for which the even order intermodulation products have even-non-integer real slopes (in dB/dB) (slopes in $\{\mathbb{R} - \{2n, n \in \mathbb{N}\}\}$).

Therefore, a predictive function f in the form U+V, with U being even and V being odd, allows the intermodulation powers of all of the orders of intermodulation products to be obtained.

The predictive function f of a method according to the invention thus allows the simple and reliable modelling of the behaviour of any non-linear electronic device in which intermodulation phenomena occur.

The predictive function f is in the form:

$$f: u \to P(|u|) + F(u) \cdot Q(|u|), \forall u \in \mathbb{R}.$$

Therefore, it is easy to distinguish the even part $P(|u|)$ from the odd part $F(u) \cdot Q(|u|)$ in the predictive function f, each part respectively allowing the even order and odd order intermodulation powers to be evaluated.

The use of the module ensures that the functions $P(|u|)$ and $Q(|u|)$ are even, regardless of the degree, integer or real, of their terms, with F being odd, so is $F(u) \cdot Q((|u|)$.

Advantageously, in a method according to the invention:
a model of a function, named predictive function f, is initially selected that allows the output signal to be theoretically obtained as a function of the input signal;
then the predictive function f is determined using at least two measured values.

Advantageously, in a method according to the invention, the predictive function f is at least partially determined by approximating at least two measured values representing intermodulation powers of the same intermodulation component using a Chebyshev transform of the predictive function f.

In particular, once the model of the predictive function f is selected, said predictive function f is determined by approximating the measured values of at least one intermodulation component using at least one Chebyshev transform of the predictive function f.

More specifically, the predictive function f is at least partially determined by approximating measured values representing intermodulation powers of the same intermodulation component using a Chebyshev transform of the predictive function f of the same order as said intermodulation component.

The predictive function f then can be determined by approximating a set of intermodulation power values of a particular single intermodulation component with a transform of the predictive function f. It can also be confirmed and verified using one or more other set(s) of intermodulation power values if these values are available.

Indeed, a method according to the invention has the advantage of allowing a reliable model to be obtained representing the real behaviour of an electronic device on the basis of a plurality of intermodulation powers of a single intermodulation component (i.e. at a single frequency). In this way, by virtue of a method according to the invention, the measurement steps on a simulated device are simplified.

The predictive function f can be determined using a plurality of sets of intermodulation power values of a plurality of intermodulation components. The predictive function f advantageously is fully determined by approximating measured values representing intermodulation powers of a plurality of intermodulation components using Chebyshev transforms of the predictive function f with the same orders as said intermodulation components.

The measured values advantageously comprise a plurality of sets of intermodulation powers each corresponding to one intermodulation component. Advantageously and according to the invention, the predictive function f (in particular the coefficients and the degrees of the terms of this function) is determined by approximating measured values comprising a plurality of sets of intermodulation power values, each set being obtained by measuring the power on an intermodulation component distinct from those from which the values of the other sets are measured.

More specifically, advantageously and according to the invention, all of the measured values are intermodulation powers. Indeed, these are the only values of interest within the context of modelling a passive electronic device (for which the transfer function is practically linear) in order to predict the intermodulation powers in real operation. The measured values nevertheless can comprise intermodulation powers of the intermodulation components, named first order components, i.e. at the frequencies, named fundamental frequencies, of the components of the input signal, and of the intermodulation component, named zero order component, i.e. an uninterrupted component.

Among the intermodulation products there are always at least two intermodulation components of the same order located in frequencies on either side of the frequencies from which they are derived. For example, in the third order, there are four intermodulation components: $IM(2,-1)=2f1-f2$, $IM(-1,2)=2f2-f1$, $IM(2,1)=2f1+f2$ and $IM(1,2)=f1+2f2$ for an input signal comprising two distinct frequency components f1 and f2. However, in the third order, only the frequencies $IM(2,1)=2f1-f2$, $IM(1,2)=2f2-f1$, named first rank (or zone 1) frequencies, are studied. Indeed, the frequencies $IM(2,1)=2f1+f2$ and $IM(1,2)=f1+2f2$ are close to the third rank harmonics of the frequencies of the input signal and are therefore spaced apart (zone 3) from the frequencies for which the intermodulation components are disruptive for receiver devices.

Advantageously, the measured values comprise intermodulation power values for the intermodulation components located on the side of the reception band of a receiver of the non-linear simulated device for which the intermodulation products are to be predicted. According to the same example, measurements are only carried out on the intermodulation product of frequency 2f2-f1 if the reception band is higher than f2 and only on the intermodulation product of frequency 2f1-f2 if the reception band is lower than f1.

Furthermore, in order to obtain a predictive function f that is as close as possible to the real behaviour of a simulated device, a plurality of intermodulation power measurements is advantageously carried out for the same intermodulation component in the output signal for a plurality of distinct input signal powers. A plurality of measured values is obtained for distinct input signal power values. In a method according to the invention, a significant number of measurements do not need to be carried out at short input signal power intervals. However, advantageously and according to the invention, a limited number of measured values is obtained by power measurements on an output signal at input signal power intervals between 1 dB and 10 dB in the range that extends from $\frac{1}{100}$ of the nominal power (maximum) of the device up to the nominal power (maximum) of the device and, if possible, beyond this nominal power. The measured values are advantageously obtained for power intervals between 1 dB and 10 dB, at least between $\frac{1}{10}$ and 1 times the nominal power of the device, for example in order to setup the device.

Advantageously, in a method according to the invention, at least one measured value is obtained through measurements on the output signal with a total input signal power between 50% and 200% of the maximum nominal power of the simulated device. In particular, in a method according to the invention, at least one measured value is obtained through measurements on the output signal with an input signal power between 80% and 150%, and, more specifically, between 90% and 110%, of the maximum power of the simulated device during operation.

The predictions realised by a method according to the invention are all the more reliable since the measured values have been reliable for a wide range of input signal powers. Indeed, the behaviour of a non-linear electronic device further differs from the behaviour of a linear device the higher the input signal power (all components/frequencies combined). It is for this reason that it is worthwhile measuring intermodulation power values of at least one intermodulation component for a high input signal power.

Furthermore, the more complex the predictive function f, particularly the more terms it comprises when it is polynomial, the higher the number of reliably evaluated intermodulation components. In particular, for an equal number of terms, the accuracy of the prediction decreases when the order of the intermodulation component for which the intermodulation powers are evaluated moves away from the highest order of the intermodulation components on which measurements have been carried out. The increase in the number of terms of the predictive function f can overcome this, but it is then more complex to determine and cannot be carried out in an analytical manner. Otherwise, intermodulation power measurements at higher orders and at orders close to those of the intermodulation components to be predictively evaluated can be carried out.

Similarly, the higher the number of intermodulation components, from which measured power values are extracted and which are approximated by Chebyshev transforms of the predictive function f, the higher the number of reliably evaluated intermodulation components. Indeed, determining the predictive function f is even more reliable when measured values have been measured on a plurality of intermodulation components and the coefficients and degrees of terms of the predictive function f are obtained by optimising values computed by the various Chebyshev transforms of orders that correspond to the orders of said intermodulation components for which values have been measured.

The coefficients and the degrees of the terms of the predictive function f (particularly the function Q for the odd order components) are determined by a digital optimisation method that allows the mean error to be minimised between the measured values and the values predicted by a predictive intermodulation function G.

Therefore, a predictive function f is constructed, for which at least one Chebyshev transform provides the measured values. More specifically, a predictive function f is constructed through at least one of its Chebyshev transforms by minimising the error between the power values computed by each Chebyshev transform and the measured values for each intermodulation product of the same order as each Chebyshev transform (including of order 0).

For example, the coefficients and the degrees of the terms of the predictive function f are determined by minimising the error between the predictive values obtained by the third order Chebyshev transform $f_3$ of the predictive function f and the measured power values of the third order intermodulation component.

In order to determine the coefficients and the degrees of the terms of the predictive function f, the error between values computed by one or more Chebyshev transforms of the predictive function f and measured values is minimised, for example, by the "least squares" method allowing the mean square error to be minimised between the values predicted on the basis of the predictive function f (by its one or more Chebyshev transform(s)) and the measured values. Furthermore, advantageously and according to the invention, the mean is weighted in order to assign a relatively higher weight to the more reliable measured values than to the less reliable measured values.

In this way, a higher weight is advantageously assigned to the measured values of the low order intermodulation components. Indeed, the power of the intermodulation components decreases as a function of their order (at equal input signal power). Thus, the noise of the measurement relative to the real value of the power of the intermodulation component is minimised for the low order intermodulation components.

More specifically, a higher weight is assigned to the measured values of the third order intermodulation component. Indeed, the low order intermodulation components are the most powerful and, among the odd order intermodulation components, the third order intermodulation component is the most powerful.

However, by focusing on high order intermodulation components (for example 10, 11 and 12), power measurements are only carried out on one or more of these components that are approximated by a method according to the invention in order to obtain a predictive function f that is particularly reliable for these intermodulation components.

Similarly, a higher weight is advantageously assigned to the measured values for high input signal powers than to the measured values for lower input signal powers in order to minimise the influence of the noise of the measurement.

In a method according to the invention, the predictive function f is therefore used in order to compute at least one intermodulation power of at least one intermodulation component with a frequency (order) that is distinct from the frequency of the intermodulation component for which the intermodulation powers have been measured in order to supply the measured values on which f has been approximated. More specifically, a method according to the invention allows the entire intermodulation power curve to be obtained in the range of operating input powers of the simulated device.

A method according to the invention also allows the powers of the intermodulation components to be determined when a large number of distinct frequency components is introduced at the input of the simulated device, particularly a large number of carrier components. More specifically, in a method according to the invention, the power of the intermodulation powers is evaluated in a specific frequency band that corresponds, for example, to a reception band in a transceiver electronic device.

Advantageously, a method according to the invention is also characterised in that the simulated device comprises at least one wideband transmission/reception antenna.

Indeed, a method according to the invention is particularly advantageous for electronic devices of this type as signals are transmitted at high power compared to the reception powers. If the transmission is distorted by intermodulation components found in the reception band, a significant amount of noise is introduced to the reception of signals.

A method according to the invention advantageously can be implemented to evaluate intermodulation powers of passive electronic devices and of active electronic devices.

Advantageously, in a method according to the invention, data representing said measured values are recorded in a memory.

Advantageously, in a method according to the invention, a microprocessor computes data representing said intermodulation powers on the basis of data representing a predictive function f stored in a memory. Said microprocessor stores said data representing said intermodulation powers in the memory.

Advantageously, in a method according to the invention, a microprocessor determines said predictive function f on the basis of data representing at least two measured values. In particular, said microprocessor determines said predictive function f according to a method according to the invention.

The invention further relates to a method for the evaluation of intermodulation power in a simulated device, characterised in combination by all or part of the features mentioned above or hereafter, including the features of the electronic device according to the invention.

The invention further relates to an electronic device adapted to be able to implement a method according to the invention. In particular, the invention further relates to an electronic device for the predictive evaluation of intermodulation power in a simulated device, named simulated device, said simulated device comprising at least one signal input and one signal output.

An electronic device according to the invention advantageously comprises at least one memory. An electronic device according to the invention advantageously further comprises at least one data processing unit, for example a microprocessor.

Advantageously, an electronic device according to the invention is adapted to store data in a memory, which data represents values, named measured values, of the measured powers of at least one component of a signal, named output signal, produced by the simulated device on an output of the simulated device from an input signal comprising at least two distinct frequency components and introduced at an input of the simulated device.

Advantageously, said at least one microprocessor is adapted to predictively provide data representing power values, named intermodulation powers, of at least one component, named intermodulation component, of an output signal produced by an intermodulation distortion between at least two components of the input signal on the basis of a function, named predictive function f, that is determined using at least two measured values. The device is also adapted to store said data representing intermodulation powers in a memory. It is also adapted to provide said data representing intermodulation powers on an output and/or on a display device.

Advantageously and according to the invention, said at least one microprocessor is adapted to determine said predictive function f on the basis of a predictive function f model stored in the memory and of at least two measured values. To this end, said device comprises data stored in a memory, which data can be accessed from said microprocessor and represents a program allowing said microprocessor to determine the predictive function f on the basis of a stored model.

More specifically, said device according to the invention is adapted to determine the value of at least one degree $q \in \{\mathbb{R}_+ - \mathbb{N}\}$ of at least one term of the function Q as a function of at least two measured values.

Advantageously and according to the invention, at least one memory of the device according to the invention comprises data representing a predictive function f model, according to which said predictive function comprises at least one odd part $V = F \cdot G$ that is formed by the multiplication of:
  an odd function F,
  and a function $G = Q \circ g$ that is the compound
    of an even function g, such that $g: \mathbb{R} \to \mathbb{R}^+$,
    by a function Q in the form of a series, named real series, comprising at least one term of degree q, with $q \in \{\mathbb{R}_+ - \mathbb{N}\}$.

Said program is adapted so that at least one term of degree q of the function Q is determined at a value in $\{\mathbb{R}_+ - \mathbb{N}\}$.

Advantageously and according to the invention, at least one memory of the device according to the invention comprises data representing a predictive function f model, according to which said predictive function comprises at least one even part U added to the odd part V so that the predictive function f is in the form $f = U + V$, with $U = P \circ g$, which is the compound
  of an even function g, such that $g: \mathbb{R} \to \mathbb{R}^+$,
  by a function P in the form of a series, named real series, comprising at least one term of degree $p \in \{\mathbb{R} - \{2n, n \in \mathbb{N}\}\}$.

Furthermore, there is nothing preventing an electronic device according to the invention from providing and injecting said input signal comprising at least two distinct frequency components at an input of the simulated device.

Moreover, there is nothing preventing an electronic device according to the invention from being adapted to carry out a plurality of power measurements of at least one component of the output signal in order to observe and record said measured values.

The invention further relates to an electronic device for the evaluation of intermodulation power in another electronic device, named simulated device, characterised in combination by all or part of the features mentioned above or hereafter, including the features of the method according to the invention.

Further objects, features and advantages of the invention will become apparent upon reading the following description, which is provided by way of non-limiting example, and with reference to the appended drawings, in which.

Figure 1:
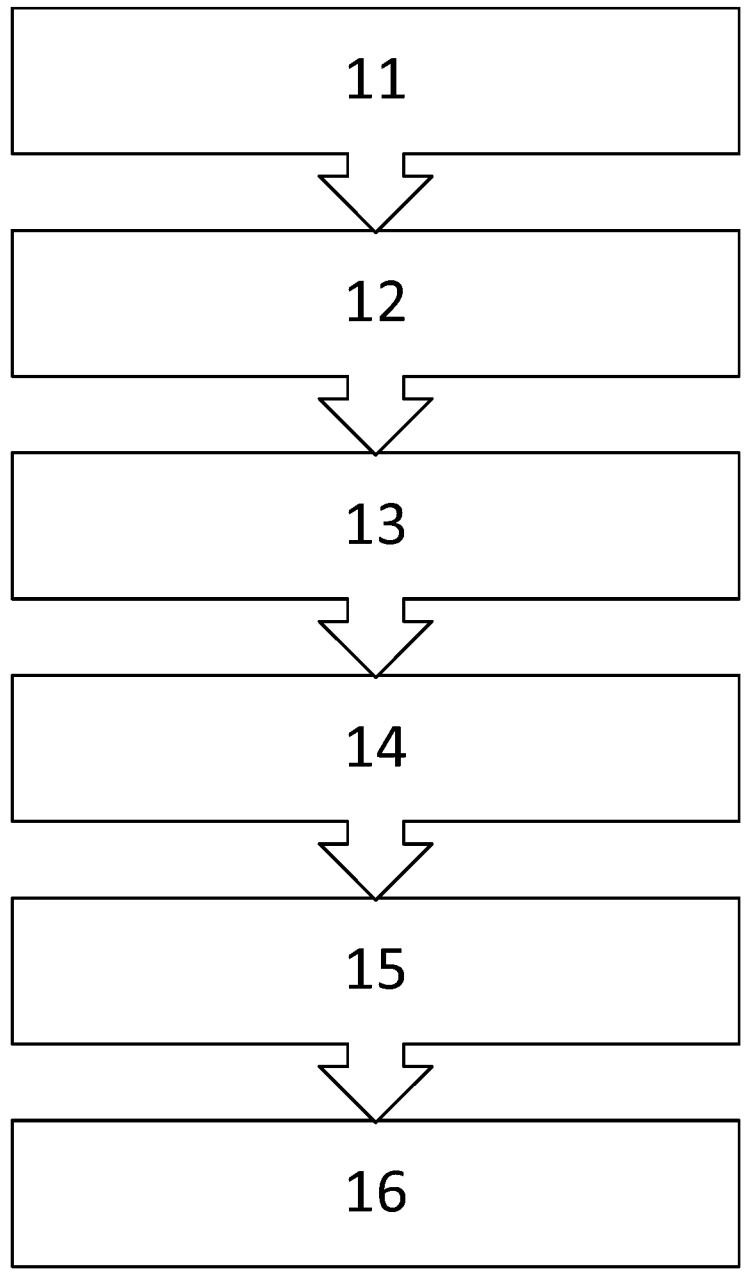
FIG. 1 is a schematic representation of the main steps of a method according to an embodiment according to the invention.

In a method according to the invention, as shown in FIG. 1, an input signal comprising two distinct frequency components is introduced at the input of a non-linear electronic device, named simulated device.

Then, in a first step 11, an input signal in the following form is introduced at the input of the simulated device:

$$Se(t)=a1\cdot\cos(\omega 1 t+\varphi 1)+a2\cdot\cos(\omega 2 t+\varphi 2)$$

where t is the time variable;

a1 and a2 are the maximum amplitudes of each input component;

$\omega 1$ and $\omega 2$ are the pulses of each input component;

$\varphi 1$ and $\varphi 2$ are the phase shifts of each input component.

The frequencies $f1=\omega\pi$ and $f2=\omega 2/2\pi$ are selected in the passband of the simulated device.

In order to carry out measurements of the power of the input signal injected at the input of the simulated device, the power transmitted by one or more transmitters generating the input signal is measured. Therefore, all of the connections, filters, guided links and antennae that may be interposed between the transmitters generating the input signal and the simulated device are taken into account and considered to be parts of the simulated device.

In a second step 12, power measurements are carried out at the output of the simulated device. These measurements are carried out at the frequency of the intermodulation components.

Measurements are carried out for one or more intermodulation components.

By way of example, a method according to the invention for modelling a non-linear electronic device and for predicting powers of intermodulation components produced by this device is shown for odd order intermodulation components. Therefore, the measurements are carried out for one or more odd order intermodulation components.

More specifically, measurements are carried out on a single intermodulation component of each order. For a given intermodulation component order, measurements are carried out on the intermodulation component located on the side of the reception band of the simulated device relative to the frequencies f1 and f2.

For example, the measurements are carried out for a third order component selected as a function of the position of said reception band. Therefore, if the reception band of the one or more receiver(s) of the simulated device is located in frequencies higher than f2, measurements are carried out on IM3(1,2)=2f2−f1. If, on the contrary, the reception band of the one or more receiver(s) of the simulated device is located in frequencies lower than f1, measurements are carried out on IM3(2,1)=2f1−f2.

The measurements are carried out using a spectrum analyser, a filter and a bolometer or a specific passive intermodulation products analyser. They allow measured values to be obtained, such as maximum amplitudes of each measured intermodulation component, said amplitudes corresponding to powers of said intermodulation components.

In order to take measurements of the power of the output signal transmitted at the output of the simulated device, the power received by one or more reception receivers of the output signal of the simulated device is measured. Thus, all of the connections, filters, guided links and antennae that can be interposed between the simulated device and the reception receivers of the output signal are taken into account and considered to be parts of the simulated device.

Figure 2:
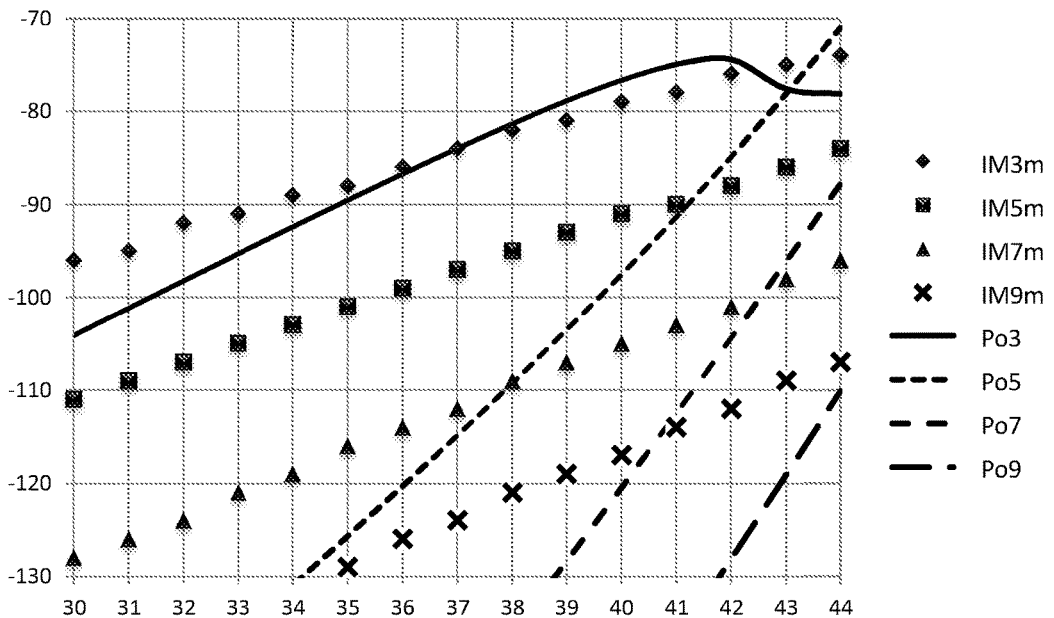
FIG. 2 is a diagram of intermodulation powers for a plurality of odd order intermodulation components, measured and modelled by a method of the prior art.
Figure 3:
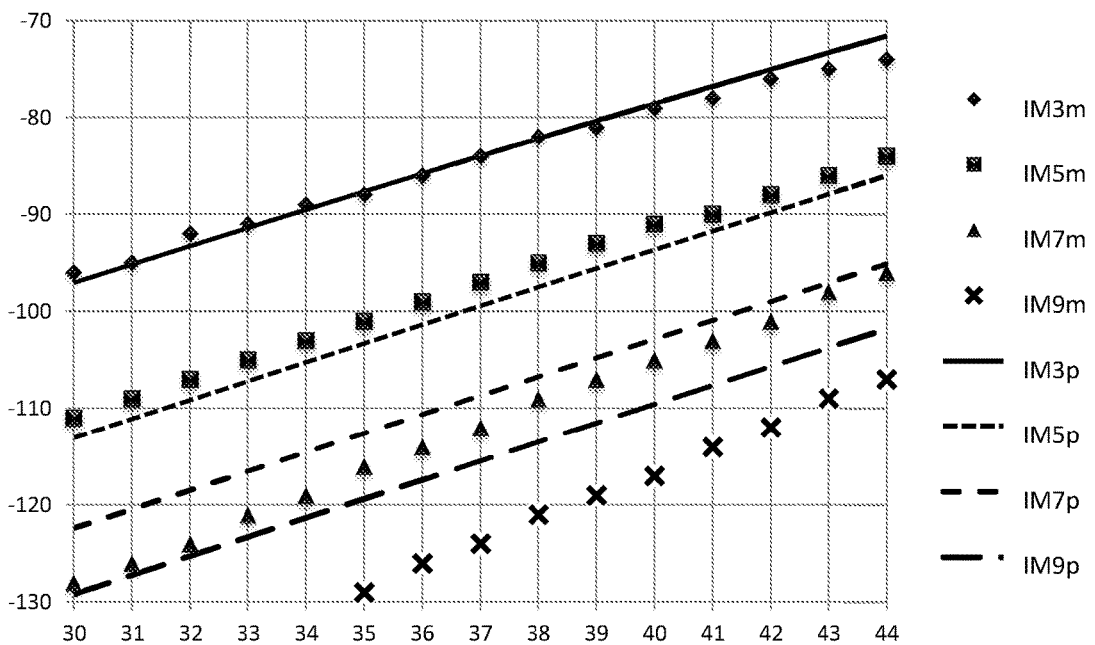
FIG. 3 is a diagram of intermodulation powers for a plurality of odd order intermodulation components, measured and modelled by odd order predictive intermodulation functions obtained according to a method according to the invention, the measured values being the same as in FIG. 2.

The measured values of the powers of the $3^{rd}$, $5^{th}$, $7^{th}$ and $9^{th}$ order intermodulation components of a non-linear electronic device are shown in FIGS. 2 and 3 by reference numerals IM3m, IM5m, IM7m and IM9m. These are shown as dBm with the powers of the input signal as dBm on the abscissa.

An active non-linear electronic device has two states: a first substantially linear low-power state of the input signal and a second saturation state for higher powers.

A passive non-linear electronic device does not have a saturation state.

In a third step 13, the mean slope of the measured values is computed. In the example shown, the mean slopes shown in the following table are obtained, according to FIGS. 2 and 3:

| | Order of the intermodulation component | | | |
|---|---|---|---|---|
| | IM3 | IM5 | IM7 | IM9 |
| Measured slope | 1.6 | 1.9 | 2.3 | 2.5 |

In a fourth step 14, a predictive function f model is selected such that it comprises an odd part V in the form:

$$V=F\cdot(Q\circ g)$$

with g being the module function, with Q: $u \rightarrow a\cdot u^{q\alpha}+\beta\cdot u^{q\beta}$, $\forall u \in \mathbb{R}_+$ and with the function F being the sign function, such that:

$$V: u \rightarrow \text{sign}(u)\cdot[\alpha\cdot|u|^{q\alpha}+\beta\cdot|u|^{q\beta}]\cdot \forall u \in \mathbb{R}$$

with $q\alpha$ and $q\beta$ being real coefficients, at least one of which is not an integer.

For such an odd part V of the predictive function f, the Chebyshev transforms can be analytically determined. The m order predictive intermodulation function $f_m$ (m order Chebyshev transform of the odd part V of the predictive function f) is:

$$f_m(a) = 2\text{sign}(a)\cdot\left(\frac{|a|}{2}\right)^{q\alpha} \frac{\Gamma(q\alpha+1)}{\Gamma\left(\frac{q\alpha+m}{2}+1\right)\cdot\Gamma\left(\frac{q\alpha-m}{2}+1\right)} +$$

$$2\text{sign}(a)\cdot\left(\frac{|a|}{2}\right)^{q\beta} \frac{\Gamma(q\beta+1)}{\Gamma\left(\frac{q\beta+m}{2}+1\right)\cdot\Gamma\left(\frac{q\beta-m}{2}+1\right)},$$

$$\forall m \in \{2n+1, n \in \mathbb{N}\}$$

Then a start value is selected for qα and qβ that is, for example, close to the mean slope of the measured values of an intermodulation component. The start values of degrees qα and qβ advantageously belong to all of the non-integer real numbers.

The start values of degrees qα and qβ also can be selected from a table, for example as a function of the type of simulated device and/or of the one or more material(s) making up said device. Therefore, the start values of degrees qα and qβ can be selected without any preliminary measurement on a simulated device, only as a function of the technical features of said simulated device. Indeed, the degrees qα and qβ represent the physical behaviour of the simulated device, yet the non-linearity of the simulated device basically depends on its type, its constituent materials and, where necessary, the quality of its electrical contacts. For example, the non-linear behaviour of a radio communication antenna mainly depends on the material from which its reflective part is produced (metal, composite (carbon fibres with strands in three directions, for example), etc.).

In the example shown qα ≃1.6 and qβ≃2.0 are selected, for example, as start values.

Start values of coefficients α and β are also selected.

In a fifth step 15, the coefficients α and β and the degrees qα and qβ are adjusted by carrying out at least one approximation of one of the sets of measured values corresponding to the intermodulation power values of one of the intermodulation components.

In the example shown, the object is to reliably determine the powers of the first odd order intermodulation components. The measured values of the third order intermodulation component are therefore approximated by the predictive third order intermodulation function $f_3$.

This approximation is carried out, for example, by a linear regression according to the "least squares" method in which the square error of the predictions made by the predictive function f is minimised by a gradient following method. This method allows the values of coefficients α and β and of degrees qα and qβ of Q to be determined Such a method can be implemented analytically in the case of a function Q and therefore of a predictive function f with a single odd part. Otherwise, a simulation method can be implemented, for example by using a real polynomial of variable $X^{1/10}$ allowing the approximation of degrees qα and qβ to be carried out in steps of 1/10.

Therefore, the odd part V of the predictive function f is determined by determining the values of the coefficients and the degrees of Q:

| α | β | qα | qβ |
|---|---|---|---|
| 1 | −0.2 | 2 | 2.5 |

In a sixth step 16, the powers of the intermodulation components are theoretically determined for the full power of the input signal and for other odd order intermodulation components using predictive intermodulation functions $f_m$, with m being odd.

In the example shown, the intermodulation powers of the third order intermodulation component are predictively evaluated for the full power of the input signal, as well as for the intermodulation powers of the $5^{th}$, $7^{th}$ and $9^{th}$ order intermodulation components.

The result of these evaluations according to a method according to the invention is shown in FIG. 3 by reference numerals IM3p, IM5p, IM7p and IM9p. It can be seen that the model is particularly reliable and accurate, particularly for the $3^{rd}$, $5^{th}$ and $7^{th}$ order intermodulation components. The predictive function f is therefore close to the real transfer function of the simulated device, at least for the odd order intermodulation components (i.e. that at least the odd part V is reliable).

Furthermore, it can be seen that the evaluations obtained by a method according to the invention do not diverge beyond the range of powers of the input signal in which the intermodulation power measurements have been carried out.

Therefore, the following is effectively obtained from the range of measurements carried out:

| | Order of the intermodulation component | | | |
|---|---|---|---|---|
| | IM3 | IM5 | IM7 | IM9 |
| Measured slope | 1.6 | 1.9 | 2.3 | 2.5 |
| Slope evaluated by a function of the prior art (FIG. 2) | 1.81 | 3.92 | 5.81 | 9 |
| Slope evaluated by the predictive function f (FIG. 3) | 1.82 | 1.93 | 1.95 | 1.96 |

The curves of the evaluation realised according to a conventional method prior to the invention for the $3^{rd}$, $5^{th}$, $7^{th}$ and $9^{th}$ order components are shown in FIG. 2 by reference numerals Po3, Po5, Po7, Po9. For this model, a simple conventional polynomial (at integer terms of degree) is used by way of predictive function. Such a model does not correspond to the real behaviour of the circuit and does not allow it to be modelled and does not allow the intermodulation powers to be predictively evaluated in a reliable manner. Indeed, an incoherence can be seen between the mean slope of the model and the mean slope of the measured values for each intermodulation order. Furthermore, the model is rendered artificially close to the measured values of the third order intermodulation component, which results in a loss of accuracy such that, on the following orders (5, 7 and 9) the results are effectively unusable. Furthermore, it can be seen that such a model rapidly diverges beyond the range of power of the input signal for which the measurements have been carried out.

A method for predictive evaluation according to the invention is particularly advantageous for determining technical specifications of electronic devices, particularly for devices operating with more than two carriers.

Indeed, for an electronic device designed to operate with 8 carriers, for example, the technical specifications are generally computed to respond to measured values with two carriers at the input signal, as it is easier and cheaper to carry out measurements on an input signal with two carriers. The measurements are carried out with powers for each carrier that are identical to their nominal power in the operating device (with 8 carriers, for example).

Consequently, the total power of the input signal during such measurements is much lower than the total power during operation. However, the specifications are generally based on a power ratio between the power of a component of the input signal (carrier) and the power of an intermodulation component, said ratio being designated C/I, and in particular $C/I_3$ for a third order intermodulation component. Consequently, the specification of the C/I ratio for an input signal with two carriers must be computed on the basis of the specification of the expected C/I ratio for a signal with 8 carriers (still according to the same example).

However, since the behaviour of the electronic devices was imperfectly simulated by functions of the prior art, this resulted in technical specifications for two carriers comprising very high C/I ratios; that are actually higher than necessary, which leads to very high manufacturing costs. Indeed, better quality devices, produced with more expensive materials, are required in order to comply with such specifications that are obtained using methods preceding the invention (integer degrees and therefore integer slopes).

By using a method according to the invention, in which at least one degree is a non-integer real number (therefore the slope is a non-integer real number), the simulation of an electronic device is more reliable, such that the technical specification for the two carrier C/I ratio is different. A method according to the invention therefore allows the technical specification to be best adjusted to the real expected behaviour of the device during operation, with 8 carriers, for example.

The following table shows the two carrier specification that needs to be requested in order to obtain the same performance of 115 dB for 8 carriers, as a function of the slope in dB/dB (or degrees) as a function of the input power measured with two carriers.

The reference is the conventional case provided by a method according to the prior art, in which a polynomial of degree 3 is used to simulate the behaviour of the device with respect to a third order intermodulation component.

| Model used | Degree of the function Q (slope in dB/dB) | Requested C/I$_3$ performance for 8 carriers (dB) | Requested C/I$_3$ specification for 2 carriers (dB) | Relaxation of the specification compared to the reference (dB) |
| --- | --- | --- | --- | --- |
| Invention | 1.5 | 115 | 108.3 | 12.7 |
| Invention | 2 | 115 | 112.5 | 8.5 |
| Invention | 2.5 | 115 | 116.7 | 4.3 |
| Prior art | 3 | 115 | 121 | 0 |
| Invention | 3.5 | 115 | 125.4 | −4.4 |

Thus, in the case where the behaviour of the simulated device with respect to a third order intermodulation component could be reliably simulated by a predictive function f of degree 2.5, it can be seen that a predictive evaluation carried out with a method according to the prior art (of degree 3) would result in the specification of a requirement for 4.3 dB, which is higher than the specifications computed by a method according to the invention. The invention therefore provides significant savings for the manufacturers of such electronic devices.

Thus, the inventors have realised that, in certain cases, an antenna made of a composite material of carbon fibre with three strands deposited in three main directions 120° from each other, which antenna is therefore of poorer quality but is also much cheaper than a metal antenna, and subjected to a two carrier test, complies with the technical specifications re-evaluated by a method according to the invention, whereas it would have been refused according to technical specifications obtained by a method according to the prior art. Indeed, they have determined that the behaviour of such an antenna is perfectly modelled by a predictive function f comprising a term of degree between 2.2 and 2.3. In this way, this allows the expected specification to be relaxed in a two carrier test of 6 to 7 dB compared to a model realised with a comparative function h of degree 3 of the prior art. Such antennae made from composite material also have further advantages, such as having better mechanical resistance and being much lighter, and these properties are extremely important for satellites, for example, or for ground-based telecommunication antennae.

By contrast, the last row indicates that when the behaviour of the simulated device with respect to a third order intermodulation component is better simulated by a predictive function f of degree 3.5 than by a function of integer degree equal to 3, the technical specifications on the two carrier C/I$_3$ ratio must be more demanding, so that the devices that are designed according to the predictions obtained by methods of the prior art will not operate optimally during normal operation with 8 carriers.

Furthermore, in order to predictively evaluate the intermodulation powers of the even order intermodulation components, the method according to the invention, as previously described (steps 11 to 16), can be repeated with the even order intermodulation components. During the fourth step 14, for example, an even part U of the predictive function f is selected in the form U=P∘g, with g being the module function, $$P: u \to \gamma \cdot u^{p\gamma} + \delta \cdot u^{p\delta}, \forall U \in \mathbb{R}_+,$$

so that:

$$U: u \to \gamma \cdot |u|^{p\gamma} + \delta \cdot |u|^{p\delta}, = u \in \mathbb{R}$$

The m order Chebyshev transform of the even part U of the predictive function f is:

$$f_m(a) = 2\left(\frac{|a|}{2}\right)^{p\gamma} \frac{\Gamma(p\gamma+1)}{\Gamma\left(\frac{p\gamma+m}{2}+1\right) \cdot \Gamma\left(\frac{p\gamma-m}{2}+1\right)} + 2\left(\frac{|a|}{2}\right)^{p\delta} \frac{\Gamma(p\delta+1)}{\Gamma\left(\frac{p\delta+m}{2}+1\right) \cdot \Gamma\left(\frac{p\delta-m}{2}+1\right)},$$

$$\forall m \in \{2n, n \in \mathbb{N}\}$$

Then the coefficients γ and δ and the degrees pγ and pδ are determined by a method for approximating measured values that is identical to the method used for the odd part V. The start values of pγ and pδ are, however, selected from the set of real numbers to the exclusion of the even integers.

Figure 4A:
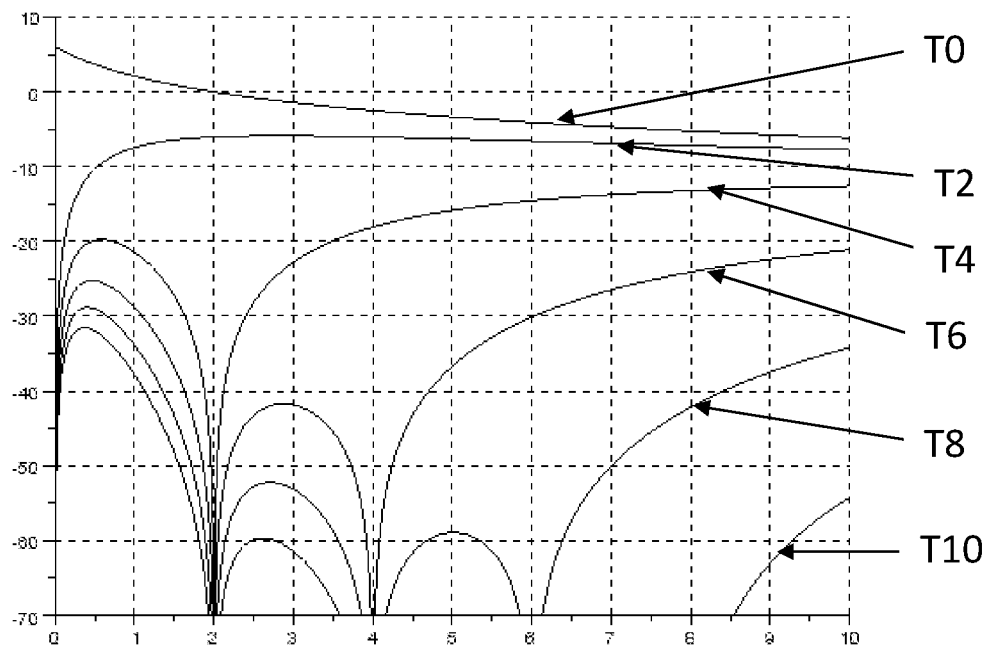
FIGS. 4a and 4b are diagrams representing values and zeros of a plurality of predictive intermodulation functions (or Chebyshev transforms), of even orders in FIG. 4a and of odd orders in FIG. 4b, respectively, for a predictive function f according to the invention, namely a one term real polynomial, said diagrams being plotted as a function of the degree of the term of the real polynomial.
Figure 4B:
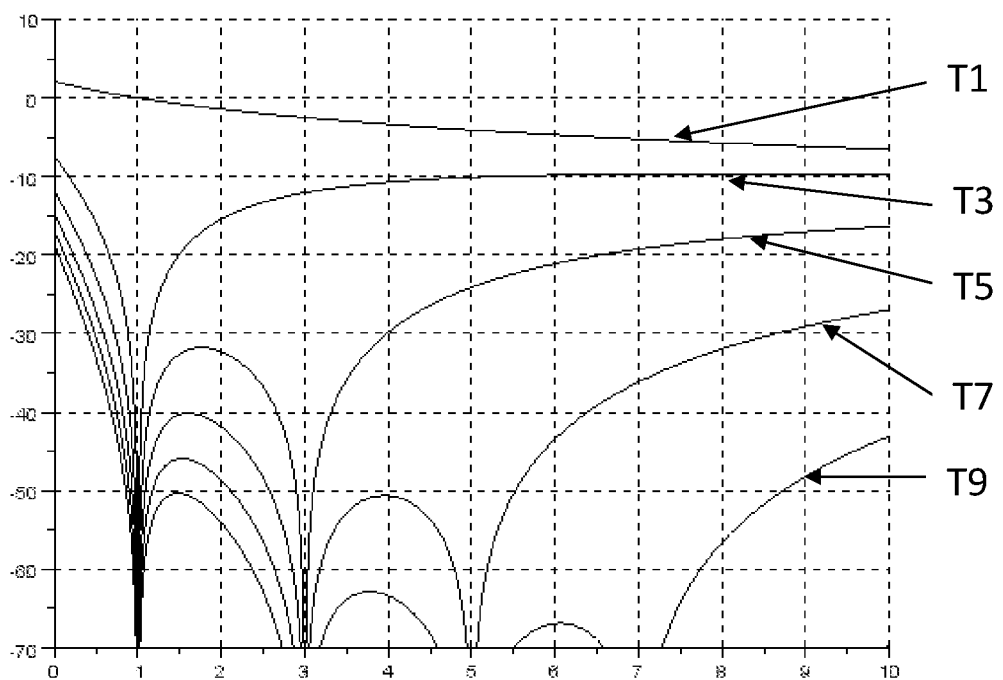

Thus, a method according to the invention also allows the powers of the even order intermodulation products to be determined The powers of the intermodulation components, even and odd components, respectively, are shown in FIGS. 4a and 4b as a function of degrees p∈$\mathbb{R}$ and q∈$\mathbb{R}$, on the abscissa, for a simple predictive function f in the form:

$$f: u \to |u|^p + \text{sign}(u) \cdot |u|^q, \forall u \in \mathbb{R},$$

with the even part of f being:

$$U: u \to |u|^p, \forall u \in \mathbb{R},$$

which allows FIG. 4a to be obtained,
with the odd part off being:

$$V: u \to \text{sign}(u) \cdot |u|^q, \forall u \in \mathbb{R},$$

which allows FIG. 4b to be obtained.

The curves of FIG. 4a correspond to the even order (from 0 to 10) predictive intermodulation functions that are the even order Chebyshev transforms (respectively from 0 to 10) of this even function U. They are shown by reference numerals T0, T2, T4, T6, T8 and T10.

The curves of FIG. 4b correspond to the odd order (from 1 to 9) predictive intermodulation functions that are the odd order Chebyshev transforms (respectively from 1 to 9) of this odd function V. They are shown by reference numerals T1, T3, T5, T7 and T9.

Therefore, it can be seen that for any p even integer (q odd integer, respectively), a conventional case is found in which only the even order intermodulation components that are less than or equal to p (of odd order less than or equal to q, respectively) can be evaluated as they are non-zeros. Therefore, for example, it can be seen that where q=5, only the 1$^{st}$, 3$^{rd}$ and 5$^{th}$ order intermodulation components assume a value other than zero.

However, it can be seen that when p is a real number that is not an even integer (p∈{$\mathbb{R}_+$-{2n}}, n∈$\mathbb{N}$ }, the even part U of f allows the powers to be computed of all of the even order intermodulation products.

Similarly, with at least one of the degrees q being a non-integer real number (q∈{$\mathbb{R}_+$-$\mathbb{N}$ }), the odd part V of f allows the powers of all of the odd order intermodulation products to be simply and reliably computed.

In a method according to the invention, it is therefore sufficient for a single term of the even part U (of the odd part V, respectively), in the form of a real series or a real polynomial, to be of even-non-integer real degree (non-integer real number, respectively) in order for all of the even order intermodulation components (odd, respectively) to be evaluated, regardless of their order and regardless of the value of the degree of said term.

Thus, for example, it can be seen that where q=2 or q=2.5 all of the odd order intermodulation products are non-zeros (orders 1, 3, 5, 7 and 9 shown in FIG. 4b). Similarly, where p=2.5 or p=3, all of the even order intermodulation products are non-zeros (orders 0, 2, 4, 6, 8 and 10 shown in FIG. 4a).

The invention can be the object of numerous other variations.

Thus, other odd functions can be used instead of the sign function. In particular, a hyperbolic tangent function in the form tan h(ku), where u is the variable and k is a real number selected with a high absolute value, can be used. The advantage of the hyperbolic tangent function is its continuity on all of the real numbers $\mathbb{R}$.

Furthermore, a distinct function g of the module function can be selected from the even functions with positive values in $\mathbb{R}$.

Thus, there is nothing preventing the even parts U=P∘g and/or odd parts V=F·(Q∘g) from being replaced by other functions.

The invention claimed is:

1. A method for the predictive evaluation of intermodulation power in an electronic device, named physical device, said physical device comprising at least one signal input and one signal output, the method comprising:
   providing an input signal at the signal input of said physical device, wherein the input signal comprises at least two components with distinct frequencies;
   measuring, by said physical device, at least one power of at least one component of a second signal that is based on the input signal;
   generating, by said physical device at the signal output, measured values representing the at least one power of at least one component of the second signal, as an output signal;
   predictively evaluating power values, named intermodulation powers, of at least one intermodulation component of the output signal using a predictive function f and at least two measured values, wherein the intermodulation component is formed, by an intermodulation distortion between the at least two components of said input signal
   wherein:
   said predictive function f comprises at least one odd part V=F·G, formed by the multiplication:
      of an odd function F,
      and of a function G=Q∘g
      of an even function, such that g: R→R$^+$,
      by a function Q in the form of a series, named real series, comprising at least one term of degree q, with q∈{R$_+$-N},
   a value of said degree q is adjusted by carrying out at least one approximation of at least two of said measured values, and
   each intermodulation power of each intermodulation component is evaluated by a Chebyshev transform of at least part of said predictive function f, said at least part being chosen between an odd part and an even part of said predictive function f.

2. The method as claimed in claim 1, wherein said function F is the sign function that assigns its sign function to any element of R, with any real number u and any real number k:

$F: u \to \text{sign}(u), \forall u \in \mathbb{R}.$

3. The method as claimed in claim 1, wherein said function F is a hyperbolic tangent function in the form, with any real number u and any real number k:

$F: u \to \tan h(ku), k \in \mathbb{R}, \forall u \in \mathbb{R}.$

4. The method as claimed in claim 1, wherein said function g is the module function g, with any real number u, such that:

$g: u \to |u|, \forall u \in \mathbb{R}.$

5. The method as claimed in claim 1, wherein said function Q is a polynomial, named real polynomial, comprising at least one term of degree q, with q∈{R$_+$-N}.

6. The method as claimed in claim 1, wherein said predictive function f further comprises an even part U added to the odd part V so that said predictive function f is in the form f=U+V, with U=P∘g, which is the compound
   of an even function g', such that g': R→R$^+$,
   by a function P in the form of a series, named real series, comprising at least one term of degree p∈{R-{2n, n∈N} }.

7. The method as claimed in claim 1, wherein:
   said predictive function f further comprises an even part U added to the odd part V so that said predictive function f is in the form f=U+V, with U=P∘g, which is the compound of an even function g, such that g: R→R$^+$, by a function P in the form of a polynomial, named real polynomial, comprising at least one term of degree p, with p∈{R-{2n,n∈N}}.

8. The method as claimed in claim 1, wherein the measured values comprise a plurality of power values measured on a same component of the output signal, produced by the intermodulation distortion between at least two components of said input signal.

9. The method as claimed in claim 1, wherein,
   a model of the predictive function f, is initially selected that allows the output signal to be theoretically obtained as a function of the input signal;
   then the predictive function f is at least partly determined by approximating at least two measured values representing intermodulation powers of the same intermodulation component using a Chebyshev transform of said model of the predictive function f.

10. The method as claimed in claim 1, wherein said physical device comprises at least one wideband transmission/reception antenna.

11. An electronic device adapted to be able to implement a method as claimed in claim 1.

12. The electronic device as claimed in claim 11, wherein it is adapted to determine the value of at least one degree $q \in \{R_+ - N\}$ of at least one term of said function Q as a function of at least two measured values.

13. The method as claimed in claim 1, wherein said signal input is a physical signal input and said signal output is a physical signal input.

14. The method as claimed in claim 1, wherein said physical device is a physical non-linear electronic device, said signal input is a physical signal input and said signal output is a physical signal input.

15. The method as claimed in claim 14, wherein the physical non-linear electronic device is at least one of a waveguide, a transmission antenna, a reception antenna, a filter, and a transmission/reception antenna.

* * * * *